United States Patent
Namburi et al.

(10) Patent No.: US 9,250,290 B2
(45) Date of Patent: Feb. 2, 2016

(54) LATERALLY DRIVEN PROBES FOR SEMICONDUCTOR TESTING

(71) Applicant: Advantest Corporation, Tokyo (JP)

(72) Inventors: Lakshmikanth Namburi, Arcadia, CA (US); Florent Cros, Los Angeles, CA (US); Yohannes Desta, Arcadia, CA (US)

(73) Assignee: ADVANTEST CORPORATION, Tokyo (JP)

( * ) Notice: Subject to any disclaimer, the term of this patent is extended or adjusted under 35 U.S.C. 154(b) by 387 days.

(21) Appl. No.: 13/850,205

(22) Filed: Mar. 25, 2013

(65) Prior Publication Data

US 2013/0285688 A1    Oct. 31, 2013

Related U.S. Application Data

(60) Provisional application No. 61/615,145, filed on Mar. 23, 2012.

(51) Int. Cl.
*G01R 31/28* (2006.01)
*G01R 31/20* (2006.01)
*G01R 1/067* (2006.01)

(52) U.S. Cl.
CPC ........ *G01R 31/2887* (2013.01); *G01R 1/06716* (2013.01); *G01R 1/06727* (2013.01)

(58) Field of Classification Search
CPC ................................. G01R 31/28; G01R 31/20
USPC ............. 324/750.25, 754.01, 754.03, 754.11, 324/750.16, 755.01, 755.04, 755.11
See application file for complete search history.

(56) References Cited

U.S. PATENT DOCUMENTS

| | | | |
|---|---|---|---|
| 5,378,164 A | 1/1995 | Vidacovich et al. | |
| 6,144,212 A | 11/2000 | Mizuta | |
| 6,356,090 B2 | 3/2002 | Deshayes | |
| 7,015,707 B2 | 3/2006 | Cherian | |
| 7,208,964 B2 | 4/2007 | Mine et al. | |
| 7,567,089 B2* | 7/2009 | Chen et al. ............... | 324/755.11 |
| 7,607,342 B2 | 10/2009 | Huang et al. | |
| 7,671,610 B2* | 3/2010 | Kister ....................... | 324/750.16 |
| 7,692,438 B2* | 4/2010 | Machida et al. .......... | 324/755.11 |
| 7,786,740 B2* | 8/2010 | Kister ....................... | 324/754.03 |
| 8,674,717 B2* | 3/2014 | Yonezawa ................. | 324/755.07 |
| 2002/0084794 A1* | 7/2002 | Root ............................. | 324/754 |
| 2005/0164428 A1 | 7/2005 | Liu et al. | |
| 2007/0152686 A1* | 7/2007 | Kister ............................ | 324/754 |
| 2008/0238452 A1* | 10/2008 | McQuade ..................... | 324/754 |
| 2008/0290887 A1 | 11/2008 | Yamazaki | |

(Continued)

FOREIGN PATENT DOCUMENTS

| | | |
|---|---|---|
| JP | H06140480 A | 5/1994 |
| KR | 20000059206 | 10/2000 |

(Continued)

*Primary Examiner* — Patrick Assouad
*Assistant Examiner* — Lamarr Brown

(57) ABSTRACT

A method for testing a semiconductor device. The method comprises moving a probe in a vertical direction towards an electrical structure on a semiconductor device to position the probe alongside the electrical structure. A tip of the probe is positioned lower than an elevation of an outermost periphery of the electrical structure. The method also includes moving the probe in a lateral direction towards the electrical structure to contact the electrical structure. The probe tip mechanically and electrically engages the electrical structure.

20 Claims, 12 Drawing Sheets

(56) References Cited

U.S. PATENT DOCUMENTS

| | | | |
|---|---|---|---|
| 2009/0001486 A1* | 1/2009 | Heck et al. | 257/415 |
| 2009/0072851 A1* | 3/2009 | Namburi et al. | 324/762 |
| 2009/0201041 A1* | 8/2009 | Kister | 324/761 |
| 2009/0212805 A1 | 8/2009 | Chen et al. | |
| 2010/0103806 A1* | 4/2010 | Chou et al. | 369/126 |
| 2010/0109691 A1* | 5/2010 | Kister | 324/754 |
| 2010/0289512 A1* | 11/2010 | Kister | 324/750.16 |
| 2012/0068727 A1* | 3/2012 | Rathburn | 324/755.01 |
| 2012/0280703 A1* | 11/2012 | Crippa | 324/755.01 |
| 2012/0286816 A1* | 11/2012 | Kister | 324/755.01 |
| 2014/0132298 A1* | 5/2014 | Cros et al. | 324/754.03 |

FOREIGN PATENT DOCUMENTS

| | | |
|---|---|---|
| KR | 20100051269 | 5/2010 |
| WO | 2006073736 A2 | 7/2006 |

* cited by examiner

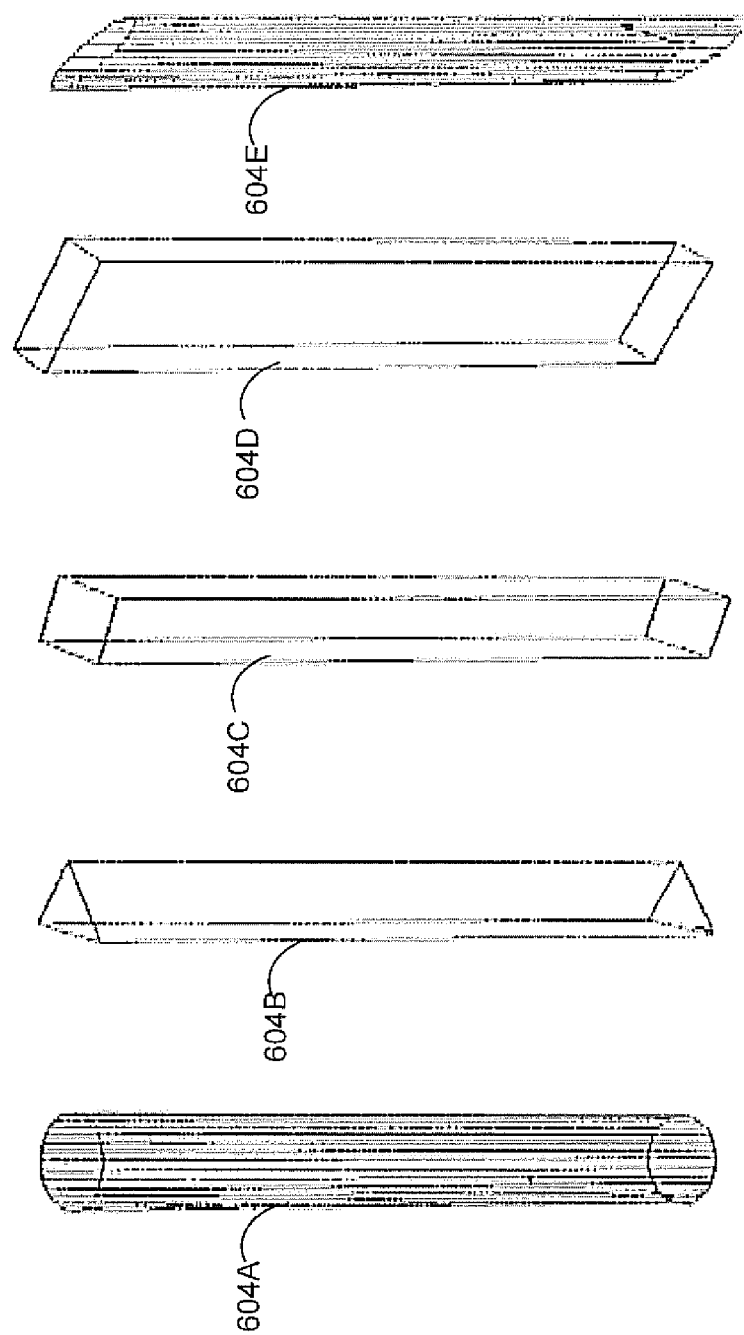

LATERALLY DRIVEN PROBES FOR SEMICONDUCTOR TESTING

CROSS-REFERENCE TO RELATED APPLICATIONS

This application claims priority to U.S. Provisional Patent Application No. 61/615,145, filed on Mar. 23, 2012, titled "LATERALLY DRIVEN PROBES FOR SEMICONDUCTOR TESTING," by Namburi, et al., which is herein incorporated by reference.

TECHNICAL FIELD

The present disclosure relates generally to the field of semiconductor device testing and more specifically to the field of probe cards for semiconductor testing.

BACKGROUND

Current probe designs, including vertical and cantilever probes, suffer from limitations in both design and manufacturing. Considerations include an increasing number of input/output channels, grounds, and power/electrical contact points and a decreasing array pitch size. Such limitations or concerns arise primarily because current probe designs require semiconductor solder bumps or balls to be mechanically engaged by a probe that continues travelling along a path substantially orthogonal to the surface of the semiconductor device even after initial contact. This continuing travel is often called vertical overdrive and is used to ensure each probe contacts a corresponding contact point regardless of local non-planarities, etc. Once an initial contact is established, some probe designs (e.g., cantilever probes) may provide a predictable amount of lateral motion of the probe to scratch a contacted electrical pad to improve the contact. Other probe designs (e.g., vertical probes) do not rely on scratching to ensure adequate probe contact, rather they rely on forming an indentation at the surface of the targeted electrical structure.

Testing solder bumps and solder balls on a semiconductor device may be challenging for both probe configurations, especially when the surface available for testing is substantially semi-spherical. Should a tip of a cantilever probe engage with a solder bump or a solder ball at a trailing edge of the spherical surface (e.g., a location substantially mid-way between the apex and the equator) a local slope may prevent the probe tip from effectively scratching the spherical surface, resulting in the probe tip sliding and straying off the bump. The sliding or straying may also be referred to as scooting. Such scooting or straying in an X and/or Y axis may also be more prevalent when shorter probe shaft lengths are used. In another scenario, a probe tip engaging with a solder bump at a leading edge of its spherical surface, digs into the bump surface rather than merely scratching it. As a result, reactive forces experienced by such probes may vary widely from an intended use, both in direction and magnitude and could lead to premature fatigue and failure of the probes.

Other significant challenges pertain to local non-planarity (height differences) of the individual solder bumps and a leveling of the semiconductor chip, etc. To account for such variations in planarity, vertical or cantilever probes may be designed to accommodate a wide range of vertical overdrive values to ensure a reliable electrical contact across the semiconductor chip (those probes that make physical contact with their respective solder bump need to absorb an amount of overdrive as the probe card continues traveling towards the semiconductor chip to allow other probes to eventually make contact with their respective solder bumps). However, in-plane movements along the shank of the probe itself invariably accompany any vertical tip motion. As the pitch between solder bumps grows smaller, so does the real-estate and a volume of space available for each individual probe. Consequently, an amount of lateral movement of a probe before any location along the probe shank engages mechanically with its direct neighbor solder bump shrinks accordingly. Moreover, as the space allocated for each probe shrinks, it becomes increasingly difficult to construct a mechanical design that allows for large overdrives while maintaining stress levels at any point along the probe below the material maximum yield stress.

As discussed herein, vertical and cantilever probes face a variety of handicaps. Probes are required to provide a vertical overdrive sufficient to ensure desired electrical and mechanical contact with semiconductor devices of increasingly smaller pitches. While also restricting a total volume of material allocated to the probe itself to absorb stresses during operation. Lastly, higher amounts of vertical overdrive sometimes required to guarantee good electrical and mechanical contact at every point on a semiconductor array (e.g., to deal with local non-planarities) may also lead to premature wear or fatigue.

SUMMARY OF THE INVENTION

Embodiments of this present invention provide solutions to the challenges inherent in testing semiconductor devices with probe cards. In a method according to one embodiment of the present invention, a method for testing a semiconductor device is disclosed. The method comprises moving a probe in a vertical direction towards an electrical structure on a semiconductor device to position the probe alongside the electrical structure. A tip of the probe is positioned lower than an elevation of an outermost periphery of the electrical structure. The method also includes moving the probe in a lateral direction towards the electrical structure to contact the electrical structure. The probe tip mechanically and electrically engages the electrical structure.

In an apparatus according to one embodiment of the present disclosure, an apparatus for electrically testing a semiconductor device is disclosed. The apparatus comprises probe card that comprises a probe. The probe comprises a vertical shank and a probe tip. The probe card is operable to position the probe above a semiconductor device such that the probe is positioned alongside an electrical structure of the semiconductor device and the probe tip of the probe is positioned lower than an elevation of an outermost periphery of the electrical structure. The probe card is further operable to move the probe in a lateral direction towards the electrical structure to contact the electrical structure. The probe tip is operable to mechanically and electrically engage the corresponding electrical structure.

In a computer system according to one embodiment of the present invention, a computer-readable medium having computer-readable program code embodied therein for causing the computer system to perform a method for testing a semiconductor device is disclosed. The method comprises moving a probe in a vertical direction towards an electrical structure on a semiconductor device to position the probe alongside the electrical structure. A tip of the probe is positioned lower than an elevation of an outermost periphery of the electrical structure. The method further comprises moving the probe in a lateral direction towards the electrical structure to contact the electrical structure. The probe tip mechanically and electrically engages the electrical structure.

BRIEF DESCRIPTION OF THE DRAWINGS

Embodiments of the present invention will be better understood from the following detailed description, taken in conjunction with the accompanying drawing figures in which like reference characters designate like elements and in which:

FIG. 6 illustrates a schematic cross-section of a plurality of exemplary probe shafts in accordance with an embodiment of the present invention;

DETAILED DESCRIPTION

Figure 1:
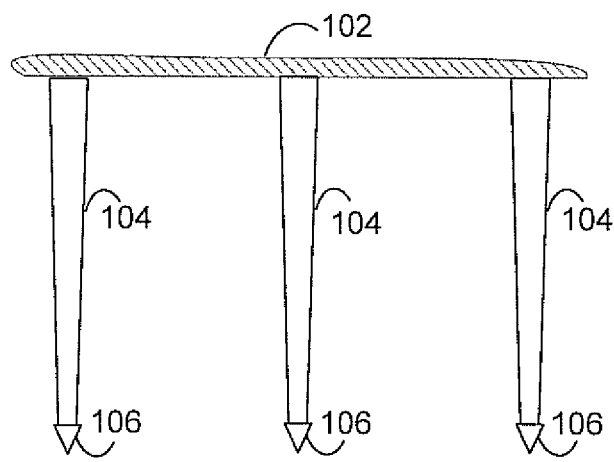
FIG. 1 illustrates a schematic cross-section of an exemplary probe card comprising a plurality of probes in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Lateral Overdrive in Semiconductor Testing:

Exemplary embodiments of this present invention provide solutions to the increasing challenges inherent in designing and operating a probe used to test solder bumps, balls, and pillars on semiconductor devices with ever shrinking pitch sizes, where the apex of such structures may varyingly culminate several micrometers to several tens of micrometers above the semiconductor chips. Various embodiments of the present disclosure provide exemplary probe designs and exemplary modes of operation that effectively circumvent a need for such compromises as described above and present laterally driven probe designs that do not rely on vertical motion (vertical overdrive) to mechanically and electrically engage with solder bumps, balls, or pillars, etc. As discussed in detail below, laterally driven testing probes are immune to solder bump, ball, or pillar height variations as they engage mechanically with an edge, sidewall, or outermost periphery of a solder ball, sphere, bump, or pillar and move towards a center of the solder ball, sphere, bump, or pillar during an exemplary lateral overdrive movement of the probe.

Exemplary in-plane dimensions of solder bumps, spheres or pillars, etc. may be typically set by photolithographic techniques, affording a high degree of precision in both position and shape reproducibility. In one exemplary embodiment, a probe card comprising a plurality of probes may be manufactured to within a submicron mirror image accuracy of a target semiconductor device. As discussed below, the probe card may be aligned with an offset to the target semiconductor device and then lowered down to place the probes of the probe card between solder bumps, balls or pillars, etc., and then are laterally shifted by shifting the probe card to contact corresponding target solder bumps, balls or pillars followed by a further lateral shift to slide the probe tips along respective target solder bumps, balls, or pillars and towards their centers. In one exemplary embodiment a range of horizontal or lateral overdrive required to establish a reliable electrical and mechanical contact across an array of solder bumps or pillars may be small, when compared to a range of vertical overdrive required for vertical probes. In one exemplary embodiment, X-axis and Y-axis placement of solder bumps and pillars is more uniform as compared to vertical heights of the solder bumps and pillars. As a direct result, stresses along the shanks of exemplary probes may be reduced, facilitating both design and fabrication, as well as extending the life of testing probes.

In one exemplary embodiment, a probe card with probes capable of lateral overdrive may have an overall length shorter than a probe card with probes used for vertical overdrive. In one embodiment, a probe card utilizing lateral overdrive may not require as much overdrive as a probe card utilizing vertical overdrive. Therefore, a probe used in a probe card that uses lateral overdrive may be physically shorter than a probe used in a probe card that uses vertical overdrive. Such a shorter probe may have less resistance and less inductance.

FIG. 1 illustrates a cross-section of a portion of an exemplary probe card 100. The probe card comprises a substrate 102 and a plurality of probes 104. In one embodiment, a probe card 100 comprises an array of probes 104 arranged in a matrix pattern to contact any number of corresponding contact elements such as solder bumps, balls, or pillars, etc. In one embodiment, the array of probes 104 are arranged in a pattern to mirror a pattern of solder bumps, balls, or pillars formed on a semiconductor device.

As illustrated in FIG. 1, an exemplary probe 104 comprises a probe tip 106. In one embodiment, the probe 104 is a needle type probe. In another embodiment, the probe 104 is a micro electro-mechanical system (MEMS) probe. In one embodiment, the probe 104 is etched from silica using photolithographic techniques. As discussed herein, in one embodiment, a probe 104, rather than bending like a spring or an accordion to provide vertical overdrive, will bend as a whisker or brush providing lateral overdrive against a target solder bump, ball, or pillar, etc.

Figure 2A:
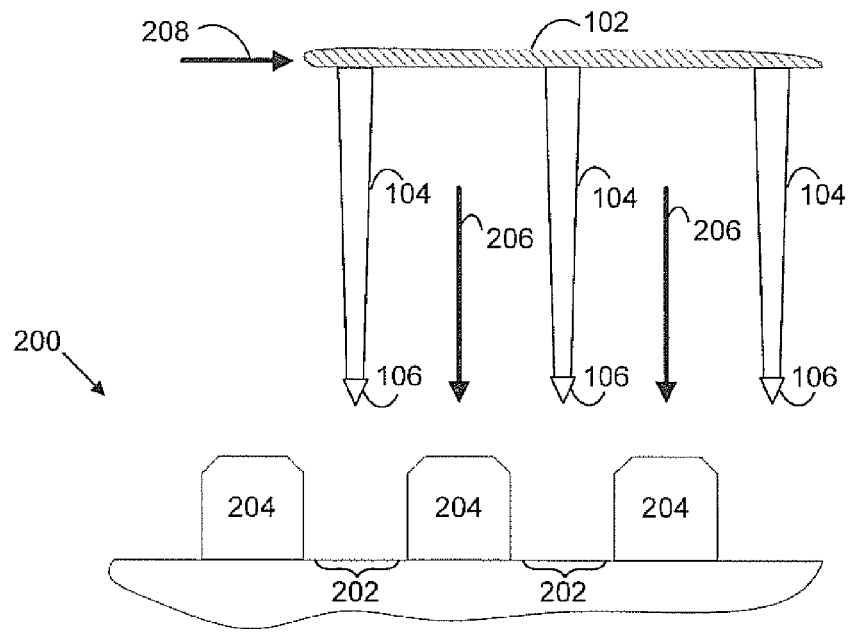
FIG. 2A illustrates a schematic cross-section of an exemplary probe card comprising a plurality of probes positioned above a plurality of components of a semiconductor device in accordance with an embodiment of the present invention.

FIG. 2A illustrates an exemplary first phase of a testing sequence using laterally driven probes 104. Size, spacing, and orientation of the probes and electrical structures have been exaggerated for the sake of clarity. While an exemplary probe card 100 may comprise hundreds or thousands of probes 104, each individually contacting a corresponding electrical structure 204 (e.g., a solder bump, sphere, pillar, etc.), a trio of probes 104 and corresponding electrical structures 204 are illustrated herein for the sake of clarity. As illustrated in FIG. 2A, after a probe card 100 is aligned with a lateral offset above a semiconductor device 200, the probe card 100 may be lowered to bring the probes 204 into position for eventual contact with corresponding electrical structures 204. In one embodiment, as illustrated in FIG. 2A, the probes 104 travel vertically towards target electrical structures 204 and surrounding semiconductor regions 202 of the semiconductor device 200 along a direction represented by arrows 206. In one exemplary embodiment, a tip 106 of the probe 104 is precisely located a few microns away from the target electrical structure 204, as determined by a lateral offset represented by arrow 208. In one embodiment, an electrical structure 204 is a solder bump, ball, or pillar, etc. In one embodiment, the semiconductor regions 202 are spaces between adjacent electrical structures 204 into which probes 104 are inserted, as discussed herein. In one embodiment, a maximum spacing or lateral offset of the probe tip 106 from the target electrical structure 204 is a spacing or distance between adjacent electrical structures 204 minus a diameter of a probe shaft or the probe tip 106 if only the probe tip 106 extends into the semiconductor regions 202 between electrical structures 204.

In one exemplary embodiment, a probe tip 106 is pyramid shaped for insertion between adjacent electrical structures 204. In another embodiment, a probe tip 106 has a same diameter or cross-section as a shaft of the probe 104 (e.g., a probe tip with a rectangular cross-section). Therefore, the probe 104 may have a diameter that is less than a spacing between adjacent electrical structures 204 to accommodate rectangular probe tips (when the probe tip 106 has the same cross-section as the probe shaft). In one exemplary embodiment, with a semiconductor device formed with a 50 micron pitch and comprising electrical structures 204 of 25 micron diameters, an exemplary spacing between adjacent electrical structures 204 is approximately 12 microns and a cross-section of a probe 104 is less than 12 microns. The sizes and dimensions of the probe 104, probe tip 106, and electrical structure 204, as well as their positions and orientations, are not to scale and are exaggerated for the sake of clarity.

Figure 2B:
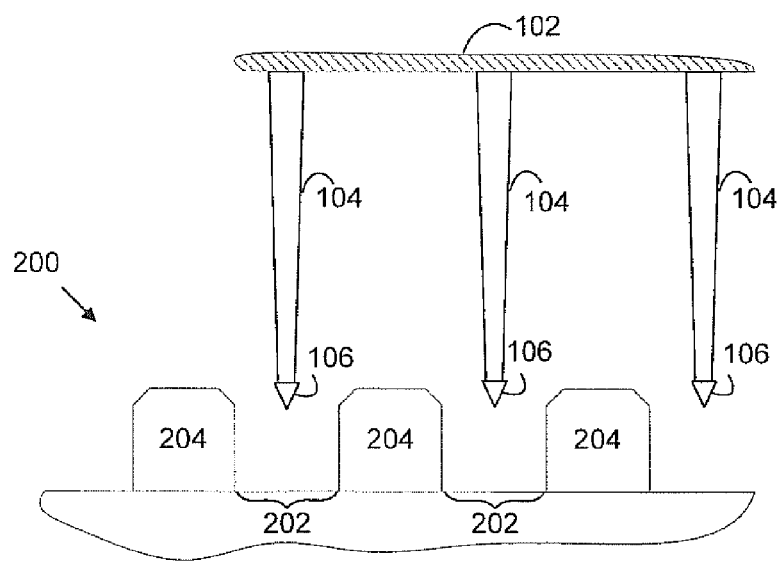
FIG. 2B illustrates a schematic cross-section of an exemplary probe card comprising a plurality of probes positioned alongside a plurality of components of a semiconductor device in accordance with an embodiment of the present invention.

FIG. 2B illustrates an exemplary end of the first phase when the probe tip 106 has reached a position substantially lower than an elevation of an outermost periphery of the target electrical structure 204. As illustrated in FIG. 2B, the probe tip 106 hovers several micrometers above the semiconductor surface 202 and below a maximum elevation of the outermost periphery of the target electrical structure 204 and several micrometers away from the outermost periphery of the electrical structure 204 as determined by the above described lateral offset.

Figure 3A:
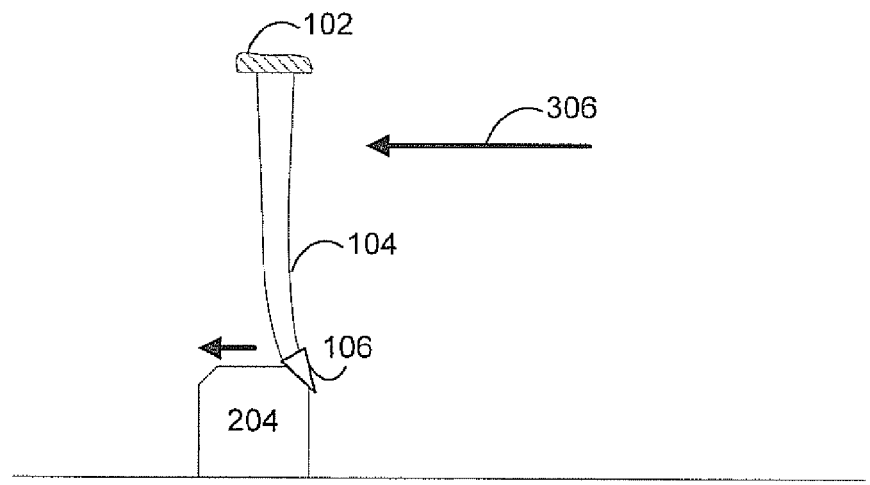
FIG. 3A illustrates a schematic cross-section of an exemplary probe moving into position against a component of a semiconductor device in accordance with an embodiment of the present invention.
Figure 3B:
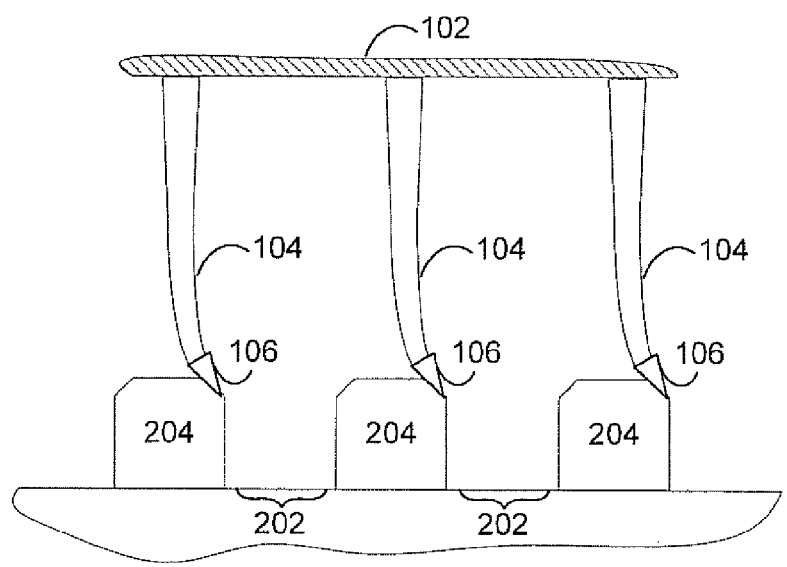
FIG. 3B illustrates a schematic cross-section of an exemplary probe card comprising a plurality of probes moving into position against corresponding components of a semiconductor device in accordance with an embodiment of the present invention.

FIG. 3A illustrates an exemplary lateral movement phase. For the sake of clarity, only a single probe 104 and a single electrical structure 204 are illustrated. The vertically positioned probe 104 travels along a path substantially parallel to a surface of the semiconductor device 200 towards the electrical structure 204 to contact a surface of the electrical structure 204, as illustrated in FIG. 3A. The general direction of the motion is represented by arrow 306. At that junction, as illustrated in FIG. 3A, the probe tip 106 has mechanically and under favorable conditions, electrically engaged with the electrical structure 204. As discussed herein, to ensure that all probes 104 of the probe card 100 have contacted their corresponding electrical structures 204, the probe card 100 will continue the lateral travel and the above probe 104 will exert a force against the electrical structure 204 that is proportional to an amount of lateral overdrive after first mechanical contact between the probe tip 106 and the electrical structure 104. FIG. 3B illustrates a plurality of probes 104 that, as illustrated in FIG. 3A, have been laterally shifted to contact corresponding electrical structures 204. However, as discussed herein, if there is X/Y axis variation(s) in position or in peripheral size of an electrical structure 204, a probe tip 106 may fail to contact the mispositioned or misformed electrical structure 204, requiring further lateral movement of the probe card 100.

Figure 4A:
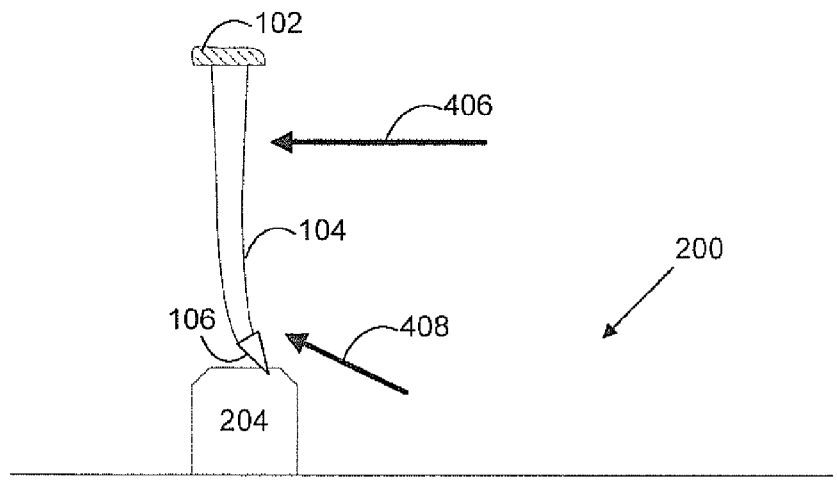
FIG. 4A illustrates a schematic cross-section of an exemplary probe moving into position against and atop a component of a semiconductor device in accordance with an embodiment of the present invention.
Figure 4B:
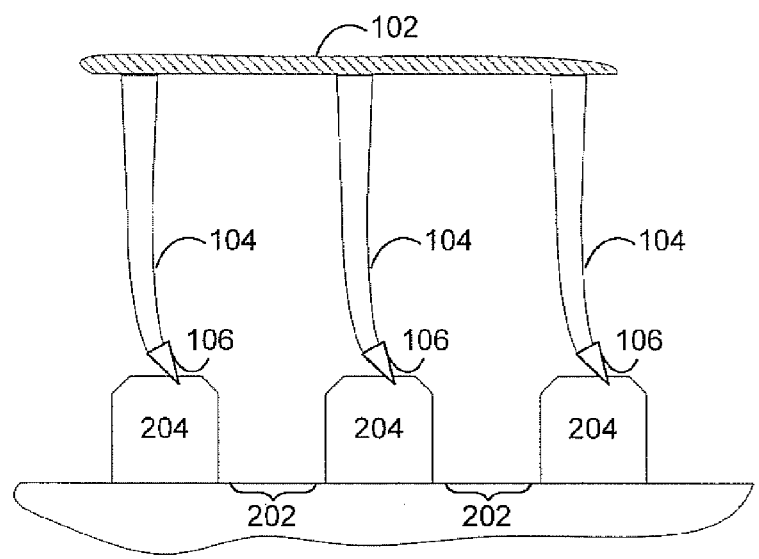
FIG. 4B illustrates a schematic cross-section of an exemplary probe card comprising a plurality of probes moving into position against and atop a component of a semiconductor device in accordance with an embodiment of the present invention.

FIG. 4A illustrates an exemplary continuation of the lateral motion phase during which the probe tip 106 has traveled towards a center of the electrical structure 204 (following arrow 408) while progressively gaining altitude with respect to the original point of contact. As discussed herein, the continuing travel of the probe tip 106 towards the center of the electrical structure 204 follows a prescribed amount of lateral overdrive. In one embodiment, as illustrated in FIGS. 3A and 4A, a needle-shaped probe 104 may bend in a whisker-like motion. Each of the probes 104 of the probe card 100 will substantially simultaneously contact corresponding electrical structures 204 as the probe card 100 is adjusted laterally (with the actual time of contact varying according to any X/Y axis variation of the electrical structures 204 of the probe card 100). FIG. 4B illustrates a plurality of probes 104 that, as illustrated in FIG. 4A, have been laterally shifted to travel towards centers of corresponding electrical structures 204 in accordance with an applied amount of lateral overdrive.

In one exemplary embodiment, an electrical structure 204 may be a solder bump or pillar with a diameter of 25 microns. As illustrated in FIG. 4A, lateral overdrive may cause the probe tip 106 to scrap along a surface of the electrical structure 204 from an edge towards a center of the electrical structure 204. For example, the probe tip 106 may scrap along the surface approximately 12 microns to be positioned near the center of the electrical structure 204. Therefore, an exemplary probe 104 may only need to bend 12 microns or less when subjected to a desired lateral overdrive after contacting an electrical structure 204 with a diameter of 25 microns. Such an exemplary amount of lateral bending (for a required amount of lateral overdrive) may be less than an amount of vertical bending (for a required amount of vertical overdrive) required due to local non-planarity and a canted semiconductor device 202. As discussed herein, a plurality of probes 104 may be manufactured with an X/Y axis precision equivalent to an X/Y axis precision of electrical structures 204 of a semiconductor device 200 (to minimize a required amount of lateral overdrive necessary to ensure consistent probe tip to target electrical structure contact). For example, in one embodiment, a range of local non-planarity and semiconductor device canting may be an exemplary 50 microns, requiring an exemplary vertical overdrive of more than 50 microns to ensure that all probe tips 106 are mechanically and electrically mated with a corresponding electrical structure 204, while a range of X/Y axis displacement of electrical structures 204 (both in placement and cross-section) may be an exemplary 10 microns, requiring an exemplary lateral overdrive of more than 10 microns to ensure that all probe tips 106 are mechanically and electrically mated with a corresponding electrical structure 204.

Figure 5:
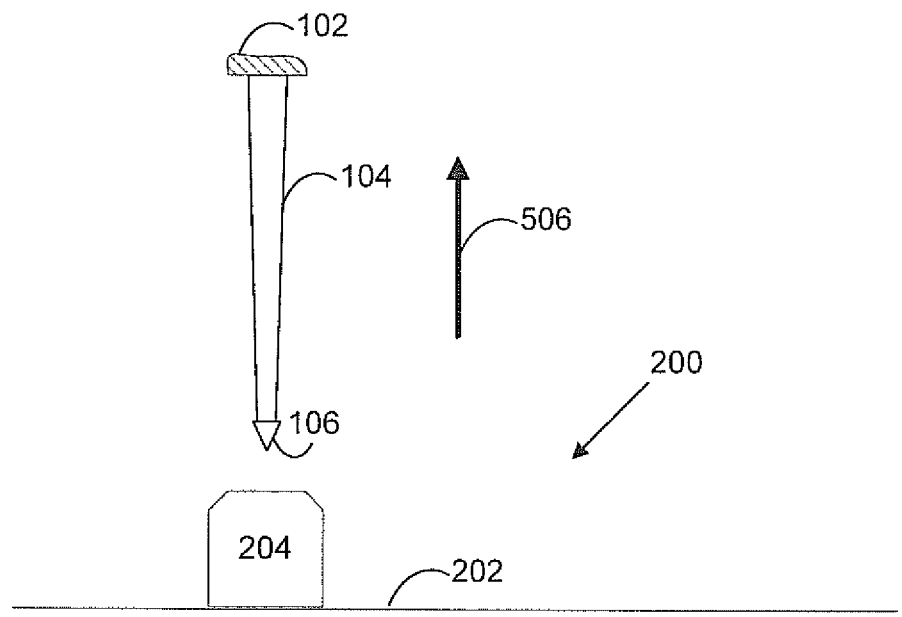
FIG. 5 illustrates a schematic cross-section of an exemplary probe moving away from a component of a semiconductor device in accordance with an embodiment of the present invention.

FIG. 5 illustrates an exemplary final phase of the testing sequence. As illustrated in FIG. 5, when testing of the semiconductor device 200 has completed, the probe card 100 (and the plurality of probes 104 contacting corresponding electrical structures 204) may be removed from contact with the semiconductor device 200. As illustrated in FIG. 5, a probe 104 is withdrawn from the semiconductor device 200 (by withdrawing the probe card 100) along a direction 506 substantially orthogonal to the surface of the semiconductor device 200.

FIG. 6 illustrates exemplary laterally driven probe designs where a shank of a probe is a vertical cylinder. In one example, a cross-section of a vertical cylinder is round 604A. In other examples, a cross-section may be triangular 604B, square 604C, rectangular 604D, or oblong 604E. In one embodiment, exemplary probes of a probe card are built following a process based on photolithography, electroplating and lapping.

Figure 7A:
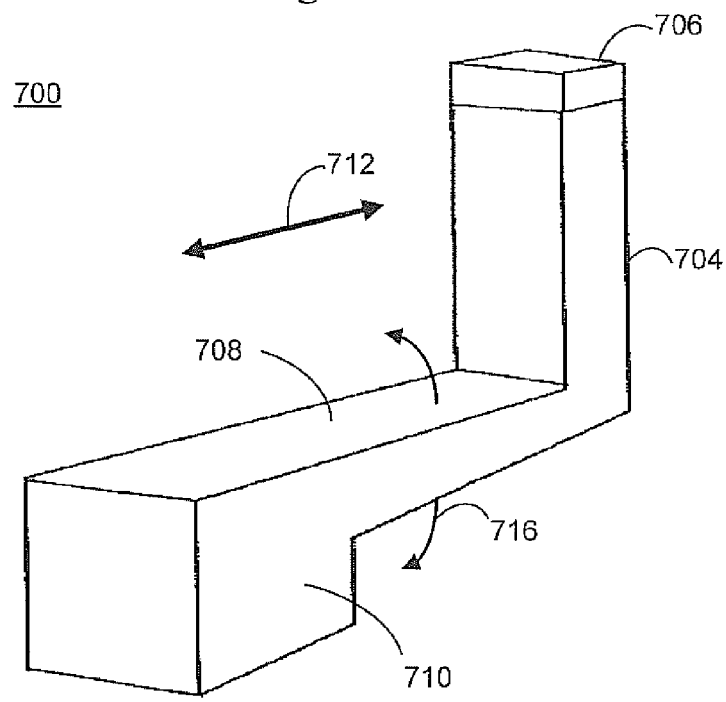
FIGS. 7A and 7B illustrate exemplary 3D views of probes in accordance with embodiments of the present invention.

FIG. 7A illustrates an exemplary probe 700 that comprises a probe tip 706, a vertical shank 704, a horizontal beam 708, and a foot 710. In one embodiment, the probe tip 706 travels towards an electrical structure 204 (e.g., a solder bump, ball, or pillar, etc.) along a path 712 substantially parallel to a long axis of the horizontal beam 708, resulting in the horizontal beam 708 bending forwards or backwards along path 716 depending on the direction of lateral overdrive. In other words, when the probe tip 706 contacts a surface of the electrical structure 204 along path 712, as illustrated in FIG. 3A, the horizontal beam 708 bends forwards or backwards depending on the direction of lateral overdrive. For example, the horizontal beam 708 will bend forward towards the foot 710 when the probe 700 is positioned to the left of a target electrical structure 204 and bend backwards away from the foot 710 when the probe 700 is positioned to the right of the target electrical structure 204.

Figure 7B:
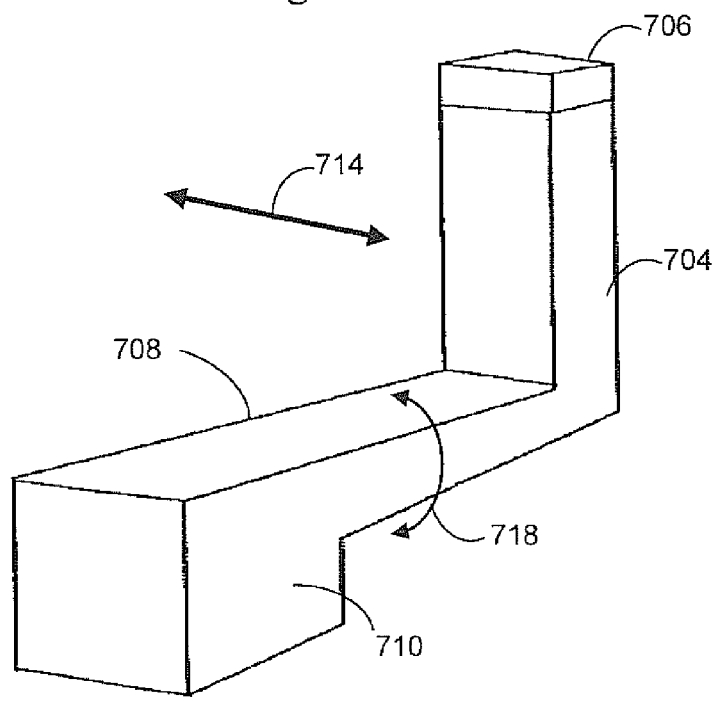

FIG. 7B illustrates a second embodiment where a probe tip 706 travels towards an electrical structure 204 along a path 714 substantially perpendicular to the horizontal beam 708. In this second method, the horizontal beam 708 experiences torsion (as illustrated by arrow 718) during an exemplary lateral overdrive. In other words, when the probe tip 706 contacts a surface of the electrical structure 204 along path 714, as illustrated in FIG. 3A, the horizontal beam 708 experiences torsion 718, with the direction of torsion dependent upon the corresponding direction of lateral overdrive (clockwise or counterclockwise torsion depending on the direction of lateral overdrive).

Figure 8:
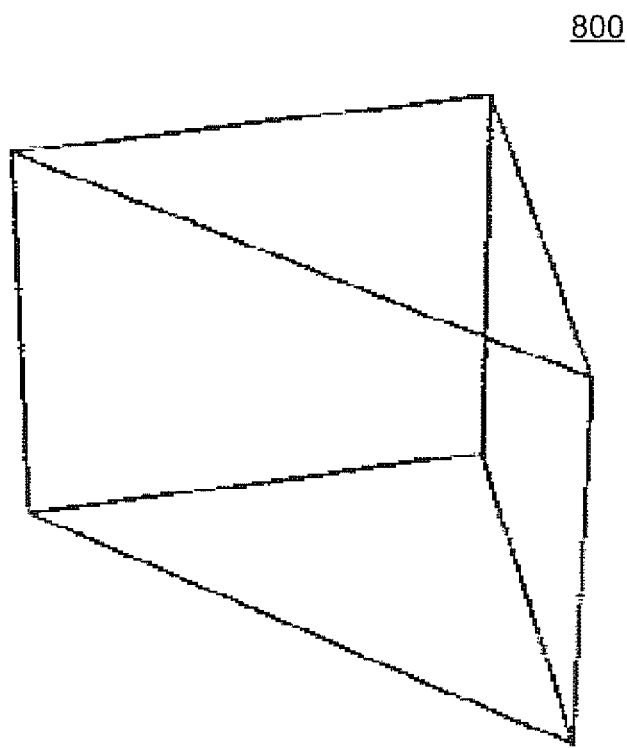
FIG. 8 illustrates an exemplary 3D view of a probe tip in accordance with an embodiment of the present invention.

In FIG. 8, an exemplary probe tip 800 has a triangular cross-section. Such a triangular cross-section is also illustrated in FIGS. 1, 2A, 2B, 3A, 3B, 4A, 4B, and 5. However, in other embodiments, the probe 104 illustrated in FIGS. 1, 2A, 2B, 3A, 3B, 4A, 4B, and 5 may comprise a probe tip 106 with a rectangular cross-section similar to a cross-section of a vertical shaft of the probe 104, as illustrated in FIGS. 7A and 7B.

Figure 9:
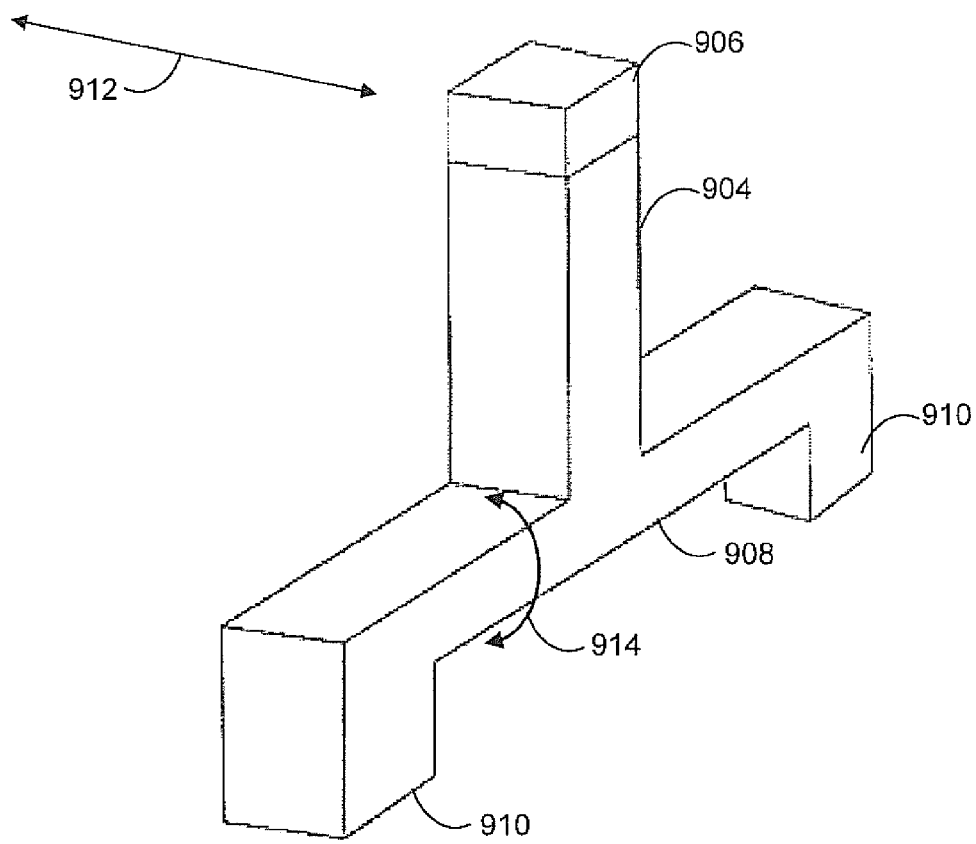
FIG. 9 illustrates an exemplary 3D view of a probe in accordance with an embodiment of the present invention.

FIG. 9 illustrates an exemplary probe 900 comprising a torsion beam 908 anchored at both ends with matching feet 910. The probe 900 also comprises a probe tip 906 and a vertical shank 904 affixed to the torsion beam 908. The probe tip 906 travels towards an electrical structure 104 along a path 912 substantially perpendicular to a long axis of the torsion beam 908. As illustrated in FIG. 9, when lateral overdrive is applied to the probe tip 906 after an initial contact with an electrical structure 204, a torsion illustrated with arrow 914 is applied to the torsion beam 908 depending on the direction of lateral overdrive as represented by arrow 912.

Figure 10A:
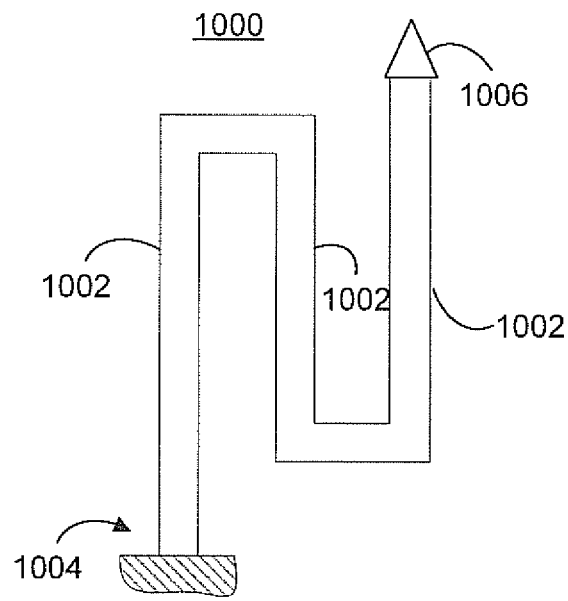
FIGS. 10A and 10B illustrate exemplary views of probes in accordance with embodiments of the present invention.
Figure 10B:
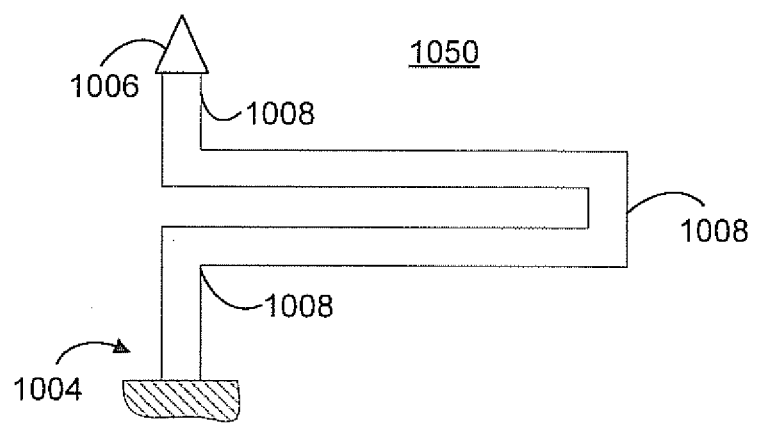

In one embodiment, illustrated in FIG. 10A, a probe 1000 is serpentine, with three or more vertical sections or beams 1002, a foot 1004, and a probe tip 1006. In another embodiment, illustrated in FIG. 10B, a probe 1050 is serpentine with three or more horizontal sections or beams 1008, a foot 1004, and a probe tip 1006. A serpentine probe 1000, 1050 may be built using MEMS techniques, such as lithography, electroplating and lapping, and subsequent removal of a sacrificial material.

Figure 11A:
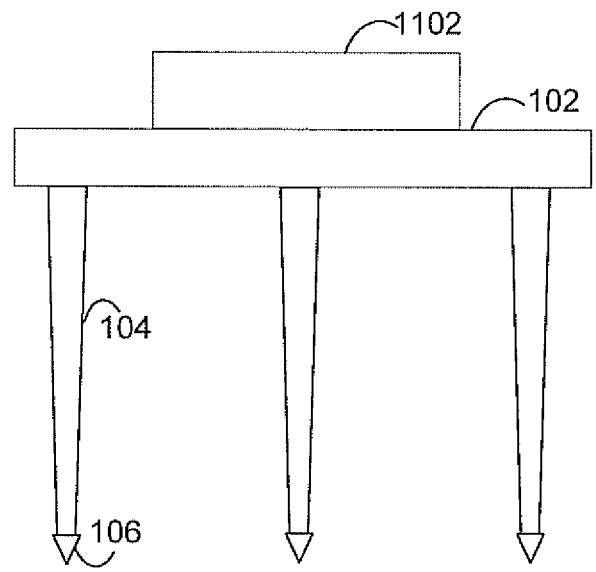
FIG. 11A illustrates a cross-section of an exemplary probe card paired with a sonic scrubber in accordance with embodiments of the present invention.
Figure 11B:
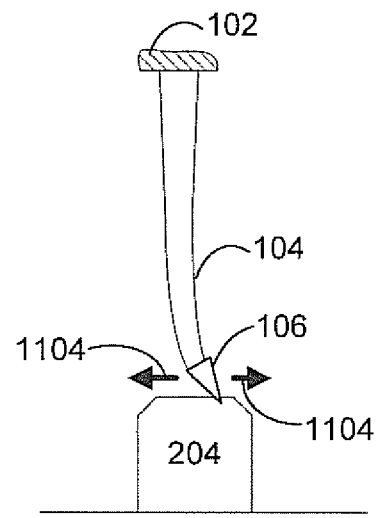
FIG. 11B illustrates a cross-section of an exemplary probe tip sonically scrubbing against a surface of an electrical structure in accordance with embodiments of the present invention.

FIG. 11A illustrates an exemplary probe card 100, as illustrated in FIG. 1, with an addition of a sonic scrubbing unit 1102. In one exemplary embodiment, after a plurality of probes 104 of the probe card 100 have had an amount of lateral overdrive applied to them, to ensure adequate electrical and mechanical contact between probe tips 106 and corresponding electrical structures 204, the sonic scrubbing unit 1102 may be activated for a selected duration. In one embodiment, the sonic scrubbing unit 1102 activates for 10 ms. As illustrated in FIG. 11B, when the sonic scrubbing unit 1102 activates, the individual probe tips 106 will be moved or scrubbed over a portion of the electronic structure 204. The scrubbing motions of the probe tip 106 during exemplary sonic scrubbing follow arrows 1104 in FIG. 11B. In one embodiment, motions of a probe tip 106 during exemplary sonic scrubbing occur in the X and/or Y axis.

Figure 12:
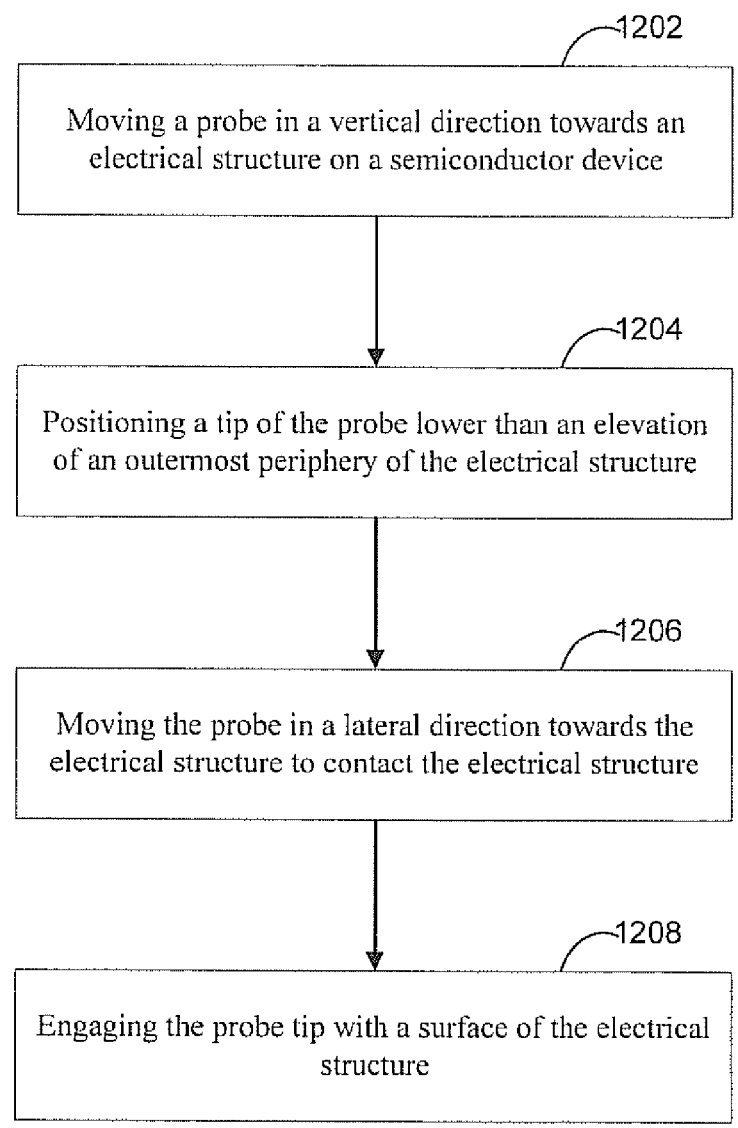
FIG. 12 illustrates a flow diagram, illustrating the steps to a method of lateral overdrive in accordance with an embodiment of the present invention.

FIG. 12 illustrates steps to an exemplary method for testing a semiconductor device. In step 1202 of FIG. 12, a probe 104 is moved in a vertical direction towards an electrical structure 204 on a semiconductor device 200 to position the probe 104 alongside the electrical structure 200. In step 1204 of FIG. 12, the probe tip 106 is positioned lower than an elevation of an outermost periphery of the electrical structure 204. Such placement of a probe tip 106 is illustrated in FIG. 2B, where the probe tip 106 is positioned lower than an elevation of an outermost periphery of the electrical structure 204.

In step 1206 of FIG. 12, the probe 104 is moved in a lateral direction towards the electrical structure 204 so as to contact the electrical structure 204. Such motion is illustrated in FIG. 3A. In step 1208 of FIG. 12, the probe tip 106 is engaged with a surface of the electrical structure 204 by scrapping the probe tip 106 along a surface of the electrical structure 204. Such contact is achieved through an applied quantity of lateral overdrive that moves the probe tip 106 along the surface of the electrical structure 204. The lateral overdrive ensures adequate mechanical and electrical contact or engagement between all of the probes 104 of a probe card 100 and their corresponding electrical structures. Such lateral overdrive is illustrated in FIGS. 4A and 4B.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for testing a semiconductor device, the method comprising:
    moving a probe in a vertical direction towards an electrical structure on a semiconductor device to position the probe alongside the electrical structure, wherein a tip of the probe is positioned lower than an elevation of an outermost periphery of the electrical structure; and
    moving the probe in a lateral direction towards the electrical structure to contact the electrical structure, wherein the probe tip mechanically and electrically engages the electrical structure.

2. The method of claim 1, wherein the probe tip exerts a force against the electrical structure that is proportional to an amount of lateral overdrive after first mechanical contact between the probe tip and the electrical structure, wherein the lateral overdrive is an amount of lateral movement of the probe.

3. The method of claim 1 further comprising, after contact with the electrical structure, moving the probe tip over an upper surface of the electrical structure and away from the outermost periphery of the electrical structure.

4. The method of claim 1, wherein the probe tip is positioned substantially in the middle of a space defined by the outermost periphery of the electrical structure and an outermost periphery of an adjacent electrical structure.

5. The method of claim 1 further comprising withdrawing the probe from the electrical structure along a direction substantially orthogonal to an upper surface of the semiconductor device.

6. The method of claim 1, wherein a shank of the probe is a vertical cylinder comprising a round, triangular, square, rectangular, or oblong cross-section.

7. The method of claim 1, wherein moving the probe in a lateral direction after the probe tip contacts the electrical structure causes tension in a shank of the probe.

8. The method of claim 1 further comprising sonically scrubbing the probe tip against the electrical structure after the probe tip makes contact with the electrical structure to mechanically and electrically engage the probe tip with the electrical structure.

9. An apparatus for electrically testing a semiconductor device, the apparatus comprising:
    a probe card comprising a probe, wherein the probe comprises a vertical shank and a probe tip;
    wherein the probe card is operable to position the probe above a semiconductor device such that the probe is positioned alongside an electrical structure of the semiconductor device and the probe tip of the probe is positioned lower than an elevation of an outermost periphery of the electrical structure;
    wherein the probe card is further operable to move the probe in a lateral direction towards the electrical structure to contact the electrical structure, and wherein the probe tip is operable to mechanically and electrically engage the electrical structure.

10. The apparatus of claim 9, wherein the probe card is further operable to exert a force with the probe tip against the electrical structure that is proportional to an amount of lateral overdrive after first mechanical contact between the probe tip and the electrical structure, and wherein the lateral overdrive is an amount of lateral movement of the probe.

11. The apparatus of claim 9, wherein the probe tip is positioned substantially in the middle of a space defined by the outermost periphery of the electrical structure and an outermost periphery of an adjacent electrical structure.

12. The apparatus of claim 9, wherein the probe card is further operable to withdraw the probe from the electrical structure along a direction substantially orthogonal to an upper surface of the semiconductor device.

13. The apparatus of claim 9, wherein the vertical shank of the probe comprises a vertical cylinder comprising a round, triangular, square, rectangular, or oblong cross-section.

14. The apparatus of claim 9, wherein the probe card is further operable to place the vertical shank of the probe in tension by moving the probe in a lateral direction towards the electrical structure after contacting the electrical structure.

15. The apparatus of claim 9 further comprising a sonic unit operable to sonically scrub the probe tip against the electrical structure after the probe tip makes contact with the electrical structure to mechanically and electrically engage the probe tip with the electrical structure.

16. The apparatus of claim 9, wherein the probe further comprises a horizontal beam and at least one foot, wherein the shank is connected to the horizontal beam and the horizontal beam is connected to the at least one foot that is connected to a probe card of the apparatus.

17. The apparatus of claim 16, wherein the horizontal beam bends when the probe tip moves in a lateral direction towards an upper surface of the electrical structure and away from the outermost periphery of the electrical structure along a path substantially perpendicular to the horizontal beam after the probe tip contacts the electrical structure.

18. The apparatus of claim 16, wherein the horizontal beam torsions when the probe tip moves in a lateral direction towards an upper surface of the electrical structure and away from the outermost periphery of electrical structure along a path substantially perpendicular to the horizontal beam after the probe tip contacts the electrical structure.

19. The apparatus of claim 9, wherein the probe tip comprises a triangular cross-section.

20. A non-transitory computer-readable medium having computer-readable program code embodied therein for causing a computer system to perform a method for testing a semiconductor device, the method comprising:
  moving a probe in a vertical direction towards an electrical structure on a semiconductor device to position the probe alongside the electrical structure, wherein a tip of the probe is positioned lower than an elevation of an outermost periphery of the electrical structure; and
  moving the probe in a lateral direction towards the electrical structure to contact the electrical structure, wherein the probe tip mechanically and electrically engages the electrical structure.

* * * * *